United States Patent
Nii et al.

(10) Patent No.: US 6,815,839 B2
(45) Date of Patent: Nov. 9, 2004

(54) SOFT ERROR RESISTANT SEMICONDUCTOR MEMORY DEVICE

(75) Inventors: Koji Nii, Tokyo (JP); Motoshige Igarashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/668,330

(22) Filed: Sep. 24, 2003

(65) Prior Publication Data

US 2004/0056278 A1 Mar. 25, 2004

Related U.S. Application Data

(62) Division of application No. 10/061,276, filed on Feb. 4, 2002, now Pat. No. 6,693,820.

(30) Foreign Application Priority Data

May 31, 2001 (JP) ........................................ 2001-165014

(51) Int. Cl.[7] ............................................... H01L 27/11
(52) U.S. Cl. ........................... 257/903; 257/66; 257/67; 257/379; 257/380; 257/381; 257/758; 257/904
(58) Field of Search .............................. 257/66, 67, 69, 257/379–381, 758, 903, 904

(56) References Cited

U.S. PATENT DOCUMENTS

| | | | |
|---|---|---|---|
| 4,825,268 A | * | 4/1989 | Oowaki ....................... 257/297 |
| 5,384,731 A | | 1/1995 | Kuriyama et al. |
| 5,468,986 A | | 11/1995 | Yamanashi |
| 5,886,375 A | | 3/1999 | Sun |
| 5,937,303 A | | 8/1999 | Gardner et al. |
| 6,162,738 A | | 12/2000 | Chen et al. |
| 6,272,039 B1 | | 8/2001 | Clemens et al. |
| 2002/0130344 A1 | | 9/2002 | Nii et al. |

FOREIGN PATENT DOCUMENTS

| | | |
|---|---|---|
| JP | 6-295999 A | 10/1994 |
| KR | 1997-0003947 | 1/1997 |

* cited by examiner

Primary Examiner—David Nelms
Assistant Examiner—Andy Huynh
(74) Attorney, Agent, or Firm—Burns, Doane, Swecker & Mathis, L.L.P.

(57) ABSTRACT

The semiconductor memory device includes two PMOS transistors that make the SRAM memory cell. The gate insulating films of these PMOS transistors are formed using a material that has a high permittivity. As a result, the capacitance of memory nodes is increased, and the probability of soft errors is lowered.

5 Claims, 11 Drawing Sheets

SOFT ERROR RESISTANT SEMICONDUCTOR MEMORY DEVICE

This application is a divisional of application Ser. No. 10/061,276, filed on Feb. 4, 2002 now U.S. Pat. No. 6,693,820.

FIELD OF THE INVENTION

The present invention relates to a semiconductor memory device having a memory cell of SRAM (static random access memory) type. More particularly, this invention relates to a semiconductor memory device improved in resistance to soft error.

BACKGROUND OF THE INVENTION

As the electronic appliances are becoming lighter, thinner and shorter recently, there is also an increasing demand for realizing the functions of these appliances at high speed. In such electronic appliances, the microcomputer is indispensable, and memories of large capacity and high speed are needed in the microcomputer. At the same time, along with the rapid spread and sophistication of personal computers, cache memories of larger capacity are required for realizing processing at higher speed.

As the RAM, generally, the DRAM (dynamic RAM) and SRAM have been used, and especially the SRAM is used where high speed processing is demanded, such as the cache memory. According to its memory cell structure, the SRAM is available in the high resistance load type composed of four transistors and two high resistance elements, and the CMOS type composed of six transistors. In particular, the CMOS type SRAM is high in reliability because the leak current while holding data is very small, and it is in the mainstream at the present.

FIG. 18 is an equivalent circuit diagram of memory cell of a conventional CMOS type SRAM. In FIG. 18, a PMOS transistor P1 (load transistor) and an NMOS transistor N1 (drive transistor) compose a first CMOS inverter, and a PMOS transistor P2 (load transistor) and an NMOS transistor N2 (drive transistor) compose a second CMOS inverter, and input and output terminals are connected complementarily between the first and second CMOS inverters.

That is, a flip-flop circuit is composed of these MOS transistors P1, P2, N1, and N2, in FIG. 18 and the logic state can be written and read at a memory node NA which is the output point of the first CMOS inverter and also the input point of the second CMOS inverter, and a memory node NB which is the output point of the second CMOS inverter and also the input point of the first CMOS inverter.

Further, NMOS transistors N3 and N4 function as access transistors, and the NMOS transistor N3 has its gate connected to a word line WL, the source connected to the memory node NA, and the drain connected to a positive phase bit line BL. The NMOS transistor N4 has its gate connected to the word line WL, the source connected to the memory node NB, and the drain connected to a negative phase bit line BLB.

That is, by selection of word line WL, positive phase bit line BL, and negative phase bit line BLB, the memory value stored in the memory node NA or NB can be read out.

FIG. 19 is a layout diagram of SRAM memory cell corresponding to the equivalent circuit shown in FIG. 18. As shown in FIG. 19, one SRAM memory cell is formed on an N-type well region NW and a P-type well region PW formed on a semiconductor substrate. Further, PMOS transistors P1 and P2 shown in the equivalent circuit are formed in the same N-well region NW, and NMOS transistors N1 to N4 are formed in the same P-well region PW.

The PMOS transistor P1 comprises a source region and a drain region, which are P+ diffusion regions FL100 and FL110 formed by injection of P-type impurity respectively, and a gate region formed between the P+ diffusion regions FL100 and FL110 and a polysilicon wiring layer PL110. Similarly, the PMOS transistor P2 comprises a source region and a drain region, which are P+ diffusion regions FL100 and FL120 formed by injection of P-type impurity respectively, and a gate region formed between the P+ diffusion regions FL100 and FL120 and a polysilicon wiring layer PL120. That is, the PMOS transistors P1 and P2 share the P+ diffusion region FL100 as the source region.

The NMOS transistor N1 comprises a source region and ga drain region, which are N+ diffusion regions FL200 and FL210 formed by injection of N-type impurity respectively, and a gate region formed between the N+ diffusion regions FL200 and FL210 and a polysilicon wiring layer PL110. Similarly, the NMOS transistor N2 comprises a source region and a drain region, which are N+ diffusion regions FL200 and FL220 formed by injection of N-type impurity respectively, and a gate region formed between the N+ diffusion regions FL200 and FL220 and a polysilicon wiring layer PL120. That is, the NMOS transistors N1 and N2 share the N+ diffusion region FL200 as the source region.

The NMOS transistor N3 comprises a source region and a drain region, which are N+ diffusion regions FL230 and FL210 formed by injection of N-type impurity respectively, and a gate region formed between the N+ diffusion regions FL230 and FL210 and a polysilicon wiring layer PL140. That is, the NMOS transistors N1 and N3 share the N+ diffusion region FL210 as the source region.

The NMOS transistor N4 comprises a source region and a drain region, which are N+ diffusion regions FL240 and FL220 formed by injection of N-type impurity respectively, and a gate region formed between the N+ diffusion regions FL240 and FL220 and a polysilicon wiring layer PL130. That is, the NMOS transistors N2 and N4 share the N+ diffusion region FL220 as the source region.

The polysilicon wiring layer PL110 functions also as the wiring for connecting between the gate regions of the PMOS transistor P1 and NMOS transistor N1, and the polysilicon wiring layer PL120 also functions as the wiring for connecting between the gate regions of the PMOS transistor P2 and NMOS transistor N2.

At least one or more contact holes are formed each in the P+ diffusion regions FL100, FL110 and FL120, N+ diffusion regions FL200, FL210, FL220, FL230 and FL240, and polysilicon wiring layers PL110, PL120, PL130 and PL140. In order to realize the connection and composition of the equivalent circuit shown in FIG. 18, these contact holes are mutually connected through metal or other upper wiring layers.

Various structures may be considered for upper wiring layers for connecting the contact holes, but for the ease of understanding, in FIG. 19, the connecting wiring of contact holes is indicated schematically by thick solid lines. According to FIG. 19, the P+ diffusion region FL110, N+ diffusion region FL210, and polysilicon wiring layer PL120 are electrically connected through the upper wiring layer to compose the memory node NA, and the P+ diffusion region FL120, N+ diffusion region FL220, and polysilicon wiring layer PL110 are electrically connected through the upper wiring layer to compose the memory node NB.

The P+ diffusion region FL100 is connected to a VDD line, which is a power source line, through the contact hole and upper wiring layer, and the N+ diffusion region FL200 is connected to a GND line, which is a grounding line, through the contact hole and upper wiring layer. The N+ diffusion regions FL230 and FL240 are electrically connected to the positive phase bit line BL and negative phase bit line BLB, respectively, through the contact hole and upper wiring layer. Further, the polysilicon wiring layers PL130 and PL140 are electrically connected to the word line WL through the contact hole and upper wiring layer.

A sectional structure of the conventional SRAM memory cell is explained. FIG. 20 is a sectional view along line A—A' in the conventional SRAM memory cell layout in FIG. 19. In order to form PMOS transistors P1 and P2, first, the P+ diffusion regions FL100, FL110, and FL120 partitioned by an element separation region 10 are formed on an N-well region NW. After laminating a thin insulating film 21 between the P+ diffusion regions, by laminating polysilicon wiring layers PL110 and PL120 thereon, a gate electrode electrically insulated from the N-well region NW is formed. Meanwhile, the insulating film 21 between the gate electrode and N-well region NW is the gate insulating film of the PMOS transistor.

Consequently, an interlayer film 30 is formed so as to cover the P+ diffusion regions FL100, FL110 and FL120, element separation region 10, and polysilicon wiring layers PL110 and PL120, and contact holes 41 are formed to reach from the top of the interlayer film 30 to the P+ diffusion regions FL100, FL110 and FL120. Finally, a metal wiring 51 of aluminum, tungsten, copper or other metal is formed to cover the contact holes 41, so that the wirings electrically connected to the P+ diffusion regions FL100, FL110 and FL120 are drawn out.

FIG. 21 is a sectional view along line B—B' in the conventional SRAM memory cell layout in FIG. 19. In order to form NMOS transistors N1 to N4, first, the N+ diffusion regions FL200, FL210, FL220, FL230 and FL240 are formed on a P-well region PW. After laminating a thin insulating film 22 between the N+ diffusion regions, by laminating polysilicon wiring layers PL110, PL120, PL130 and PL140 thereon, a gate electrode electrically insulated from the P-well region PW is formed. Meanwhile, the insulating film 22 between the gate electrode and P-well region PW is the gate insulating film of the NMOS transistor.

Consequently, an interlayer film 30 is formed so as to cover the N+ diffusion regions FL200, FL210, FL220, FL230 and FL240, and polysilicon wiring layers PL110, PL120, PL130 and PL140, and contact holes 42 are formed to reach from the top of the interlayer film 30 to the N+ diffusion regions FL200, FL210, FL220, FL230 and FL240. Finally, a metal wiring 52 of aluminum, tungsten, copper or other metal is formed to cover the contact holes 42, so that the wirings electrically connected to the N+ diffusion regions FL200, FL210, FL220, FL230 and FL240 are drawn out. These NMOS transistors N1 to N4 are formed simultaneously with the PMOS transistors P1 and P2.

The operation of the conventional SRAM memory cell will now be explained. In the equivalent circuit in FIG. 18, for example, supposing the memory node NA to be in logic level "H" potential state, the memory node NB is stable in logic level "L" potential state. To the contrary, when the memory node NA is in logic level "L" potential state, the memory node NB is stable in logic level "H" potential state. Thus, the memory cell composed by complementary connection of CMOS inverters has two different stable logic states depending on whether the two memory nodes NA and NB are in "H" state or "L" state, and the logic state is held as storage data of one bit.

The semiconductor memory device composed of CMOS inverters is very stable and has been free from problem in noise resistance so far. However, as the memory cell per bit becomes smaller and finer in order to realize a memory cell array of large capacity by integrating a multiplicity of memory cells, data held in the memory nodes may be inverted due to electrons generated by alpha-rays released from the package or neutron rays from the space, and soft errors are becoming serious problems.

In particular, soft errors are more likely to occur as the supply voltage declines, and in the recent semiconductor memory devices driven at lower supply voltage, it is becoming an important subject to increase resistance to soft errors.

To avoid soft errors, for example, it has been attempted to increase the capacity of memory node and increase the critical charge amount necessary for inverting the data held in the memory node. According to this method, to invert the stored data, it requires a greater quantity of electrons generated by alpha-rays or the like, so that the probability of occurrence of soft errors may be decreased.

Herein, to increase the capacity of the memory node, it is effective to reduce the thickness of the insulating films 21 and 22, or increase the area in the direction of principal plane thereof. However, from the viewpoint of forming small and thin memory cells, the method of increasing the area of insulating film is not recommended, and hence it is required to form thin insulating films to increase the capacity between the gate and substrate per unit area. However, when thin insulating films are formed, new problems are caused, such as lack of reliability or increase in leak current between the gate and substrate.

That is, since thin insulating films cannot be formed to conform to thin memory cells, the capacity between the gate and substrate is smaller, and the capacity of the memory node of the memory cell cannot be increased, and soft errors are likely to occur.

Further, in order to read and write stored data in the memory cell at high speed, the insulation of the interlayer film 30 is improved, and to decrease the coupling capacity occurring between the impurity diffusion region and polysilicon wiring layer, a material of low permittivity is used as the interlayer film 30. It means that the coupling capacity of the memory nodes NA, NB is decreased, and it is hence difficult to increase the critical charge amount of the memory nodes NA, NB, and soft errors are likely to occur.

SUMMARY OF THE INVENTION

It is an object of this intention to provide a semiconductor memory device capable of enhancing the resistance to soft errors by forming at least the gate insulating film of the load transistors for composing the CMOS inverters by using a material of high permittivity so as to increase the capacity between the gate and substrate.

The semiconductor memory device according to one aspect of this invention comprises a first inverter of which output point is a first memory node and input point is a second memory node, the first inverter including a first MOS transistor of a first conductive type; and a second MOS transistor of a second conductive type being different from the first conductive type. The semiconductor memory device also comprises a second inverter of which output point is connected to the second memory node and input point is connected to the first memory node, the second inverter including a third MOS transistor of the first conductive type; and a fourth MOS transistor of the second conductive type. The semiconductor memory device also comprises a fifth MOS transistor of the second conductive type of which drain is connected to the first memory node, source is connected to one of a pair of bit lines, and gate is connected to a word line; and a sixth MOS transistor of the second conductive type of which drain is connected to the second memory node, source is connected to other one of the pair of bit lines, and gate is connected-to the word line. Moreover, dielectric constant of a gate insulating film of the first and third MOS transistors is higher than dielectric constant of a gate insulating film of the fifth and sixth MOS transistors.

According to the above aspect, in the load transistor for composing the transistor memory circuit, by forming the gate insulating film of a high permittivity material, the capacity of the memory node connected to the gate of the load transistor is increased.

The semiconductor memory device according to another aspect of this invention comprises plural transistor element regions formed in a semiconductor layer within a same chip, and a wiring region formed by laminating plural metal wiring layers and interlayer films on the top of the transistor element regions, in which the dielectric constant of a specified portion of the interlayer film laminated on the transistor element regions is different from the dielectric constant of the interlayer film in other area than the specified portion.

According to the above aspect, by varying the dielectric constant of the specified portion of the interlayer film on the transistor element regions, the coupling capacity of the interlayer film may be different from the coupling capacity of the portion of the interlayer film other than the specified portion.

Other objects and features of this invention will become apparent from the following description with reference to the accompanying drawings.

DESCRIPTION OF THE PREFERRED EMBODIMENTS

Figure 1:
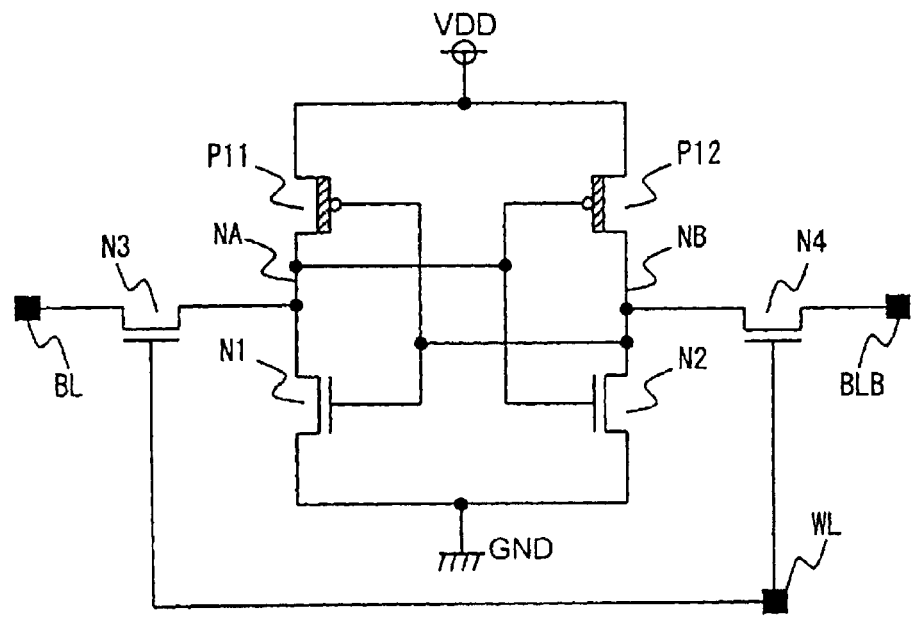
FIG. 1 is an equivalent circuit diagram of a semiconductor memory device in a first embodiment.

Embodiments of the semiconductor memory device of the invention will be described in detail below while referring to the drawings. It must be noted, however, that the invention is not limited to these embodiments alone.

To begin with, the semiconductor memory device of a first embodiment will be explained. In the semiconductor memory device of the first embodiment, a high permittivity material is used as the gate insulating film in the load transistor for composing the SRAM memory cell.

Figure 13:
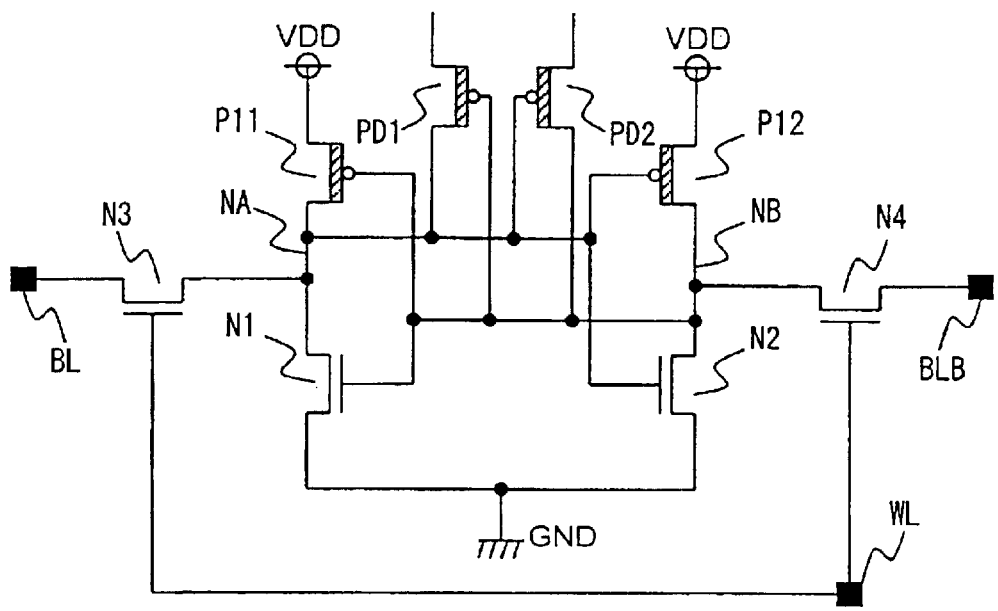
FIG. 13 is an equivalent circuit diagram of a semiconductor memory device in a fifth embodiment.

FIG. 1 is an equivalent circuit diagram of the semiconductor memory device in the first embodiment. In FIG. 1, the parts common to those in FIG. 13 are identified with same reference numerals, and their explanation is omitted. In the equivalent circuit shown in FIG. 1, what differs from FIG. 13 is that the load transistors of PMOS transistors P1 and P2 are replaced by PMOS transistors P11 and P12 having the gate insulating film formed of a high permittivity material. The other circuit composition is same as in the prior art, and the memory operation is also same as in the prior art.

Generally, in a capacitor, when the distance between the electrodes of the capacitor is constant, the higher is the dielectric constant of the material filling up the gap between the electrodes, it is known that the capacity becomes larger. That is, in the load transistor, provided the thickness of the gate insulating film is constant, the higher is the dielectric constant of the material used in the insulating material, the large becomes the capacity between the gate and substrate. Hence, when the gate insulating film of the PMOS transistors P11 and P12 is made of a high permittivity material, if the insulating film is formed in a conventional thickness, the capacity between the gates of the PMOS transistors P11 and P12 and the substrate can be increased as compared with the prior art.

The dielectric constant of the insulating film formed of a general silicon oxide $SiO_2$ is about 3.8, but materials of higher dielectric constant include, for example, $Si_3N_4$ (dielectric constant 7.5), $Al_2O_3$ (dielectric constant 9.34), $Ta_2O_5$ (dielectric constant 11.6), $ZrO_2$ (dielectric constant 12.5), $HfO_2$ (dielectric constant 25 to 40), $La_2O_3$ (dielectric constant 27), and $TiO_2$ (dielectric constant 85.8), and such high permittivity materials are used as the gate insulating film in the first embodiment. Herein, if the gate insulating film is sufficiently thin, its capacity can be increased, but, to the contrary, the gate leak current may be increased or the reliability may be impaired. In this respect, by forming the PMOS transistors P11 and P12 by using materials of high dielectric constant as the gate insulating film, if the film thickness is nearly same as in the prior art, the capacity between the gate and substrate can be increased, and a high reliability can be obtained while suppressing gate leak current.

On the other hand, in order to accelerate the follow-up to on/off changes of selection of memory cell by the word line WL, that is, the access speed, the gate insulating film of the NMOS transistors N3 and N4 functioning as access transistors is formed of a conventional ordinary dielectric material of lower dielectric constant than that of the PMOS transistors P11 and P12, and the capacity between the gate and substrate is suppressed low. Further, the gate insulating film of the NMOS transistors N3 and N4 functioning as drive transistors is made of a material of low dielectric constant. In this circuit composition, while maintaining the high speed, the capacity of the memory nodes NA and NB is increased, and the resistance to soft errors is increased.

Figure 2:
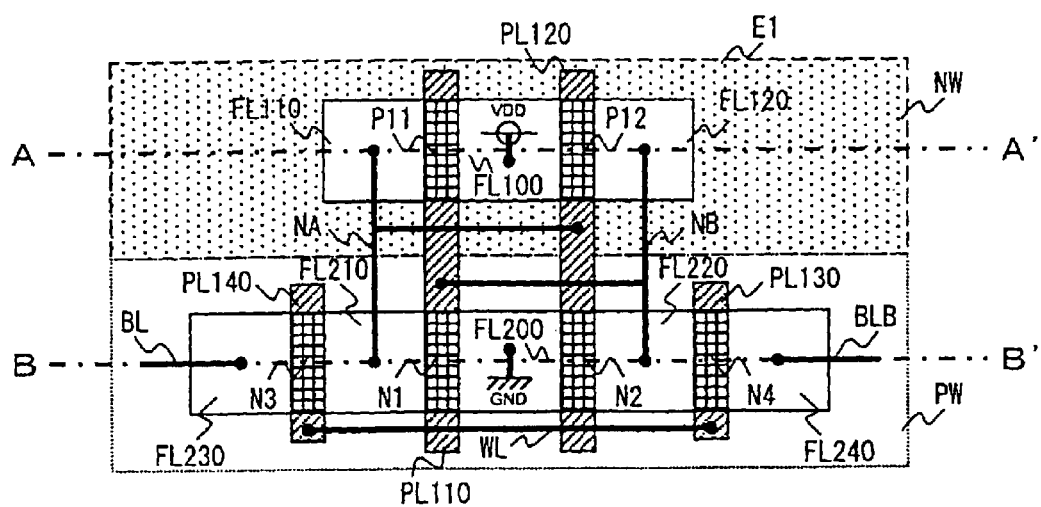
FIG. 2 is a layout diagram of SRAM memory cell corresponding to the semiconductor memory device in the first embodiment.
Figure 19:
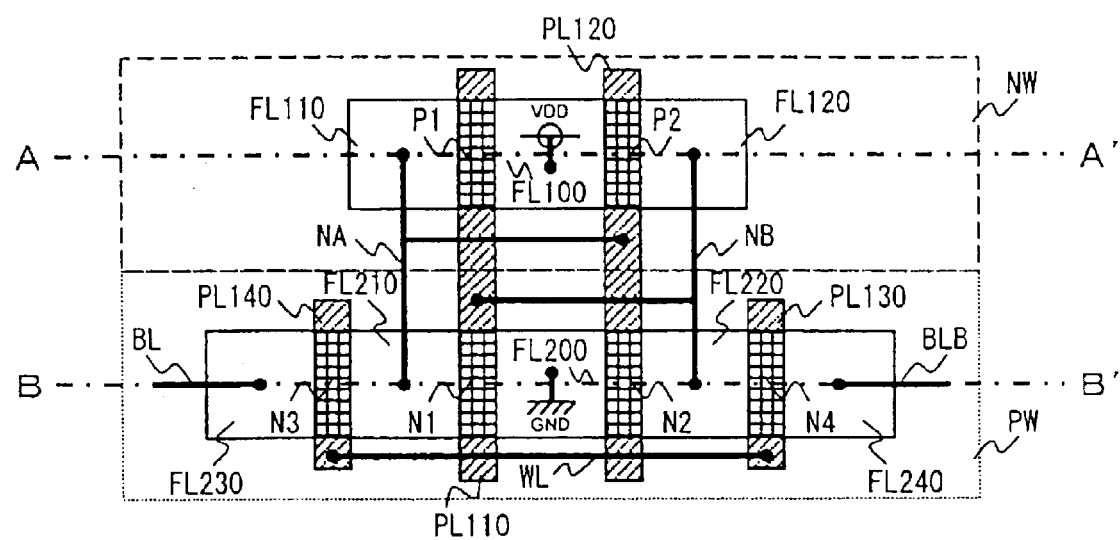
FIG. 19 is a layout diagram of the conventional SRAM memory cell.
Figure 20:
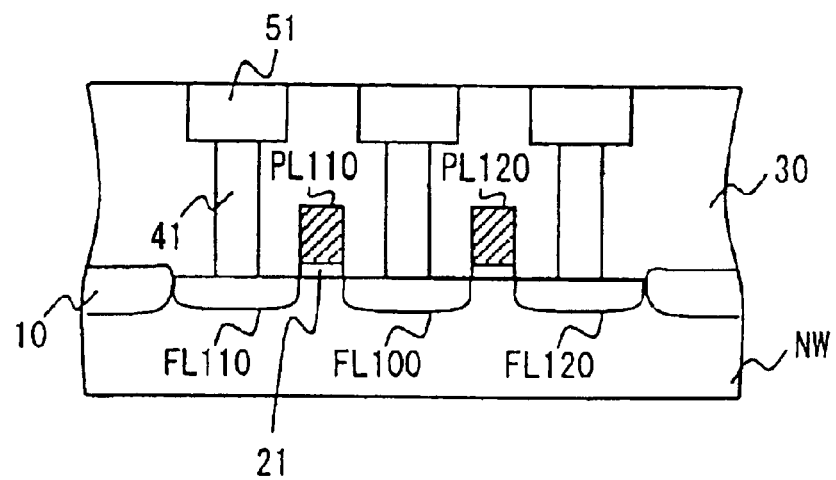
FIG. 20 is a sectional view along line A—A' of the conventional SRAM memory cell.

FIG. 2 is a layout diagram of SRAM memory cell corresponding to the equivalent circuit shown in FIG. 1. The layout diagram in FIG. 2 is similar to the layout diagram in FIG. 19 except that the gate insulating film of the PMOS transistors P11 and P12 is made of a high permittivity material. In particular, the high permittivity material is used in the lower layer area of the portion positioned within the N-well region NW, of the composition of the polysilicon wiring layers PL110 and PL120 in FIG. 2.

To form the gate insulating film, first, an insulating film such as a conventional silicon oxide $SiO_2$ is formed in the entire surface of the P-well region PW and N-well region NW, and, masking the P-well region PW, the insulating film formed on the region E1 to be formed as the N-well region NW is removed by etching. Then, the insulating film of high permittivity material is formed only in the region E1 again. The subsequent process is same as in the prior art. Moreover, the region for forming the insulating film of high permittivity material may be limited only in the region for forming the P+ diffusion region in the N-well region NW.

Figure 3:
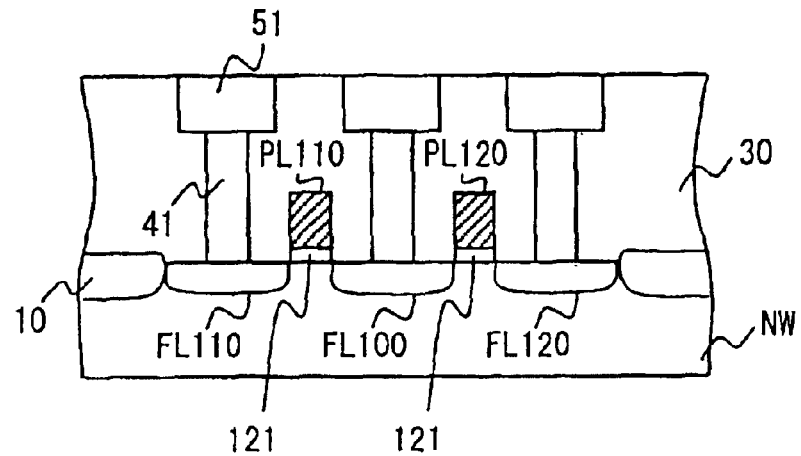
FIG. 3 is a sectional view along line A—A' of SRAM memory cell corresponding to the semiconductor memory device in the first embodiment.
Figure 21:
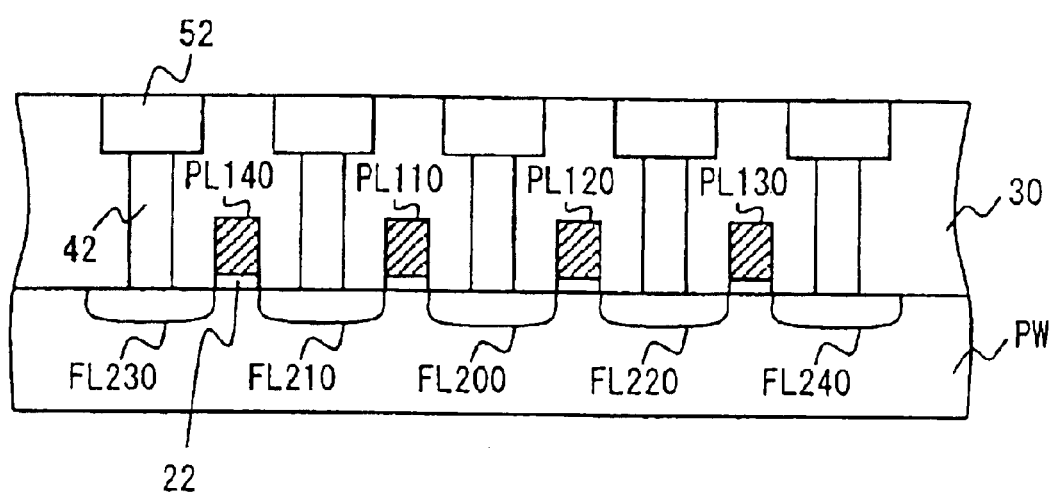
FIG. 21 is a sectional view along line B—B' of the conventional SRAM memory cell.

FIG. 3 is a sectional view along line A—A' of SRAM memory cell shown in FIG. 2. In FIG. 3, the gate insulating film 121 of the PMOS transistors P11 and P12 formed on the N-well region NW is made of a high permittivity material. The sectional view along line B—B' of the P-well region PW forming the NMOS transistors N1 to N4 is same as shown in FIG. 21, and its explanation is omitted herein.

As explained herein, according to the semiconductor memory device of the first embodiment, a high permittivity material is used as the gate insulating film only in the gate of the load transistors for forming the SRAM memory cell, by reducing the thickness of the gate insulating film, the capacity between the gate and substrate can be increased. Accordingly, the critical charge amount necessary for inverting the held data in the memory nodes NA and NB is increased, so that the resistance to soft errors can be enhanced.

The semiconductor memory device of a second embodiment will now be explained. In the semiconductor memory device of the second embodiment, a high permittivity material is used as the gate insulating film in both load transistors and drive transistors for composing the SRAM memory cell.

Figure 4:
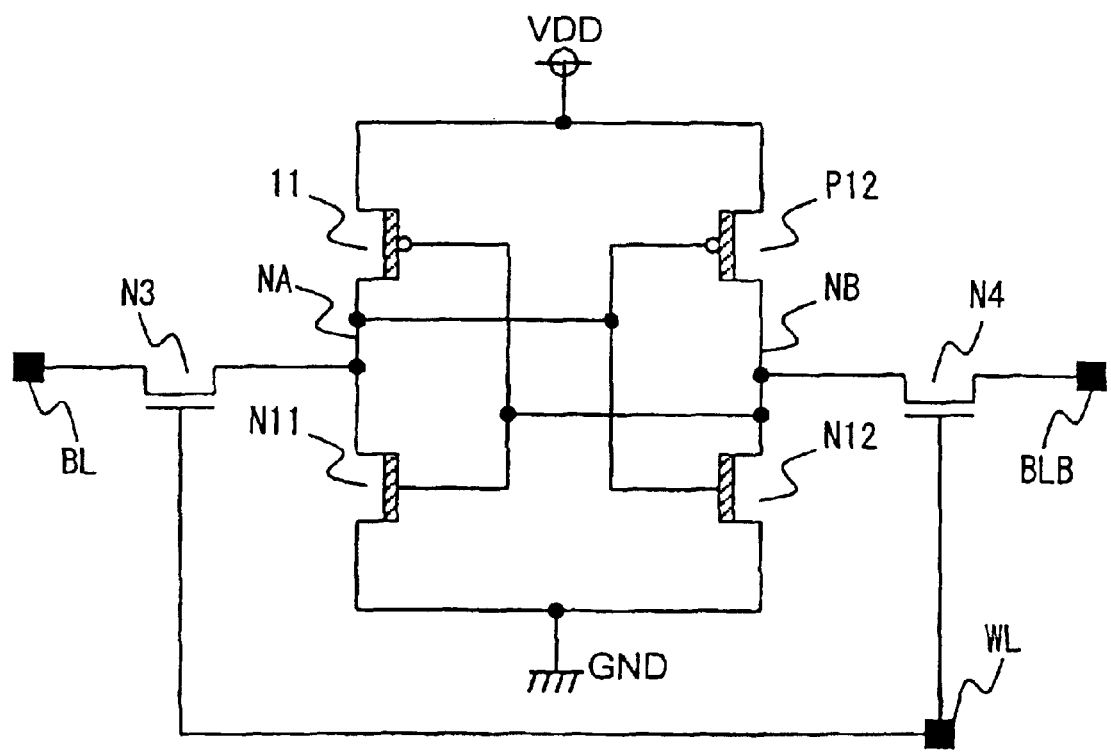
FIG. 4 is an equivalent circuit diagram of a semiconductor memory device in a second embodiment.

FIG. 4 is an equivalent circuit diagram of the semiconductor memory device in the second embodiment. In FIG. 4, parts common to FIG. 1 are identified with same reference numerals and their explanation is omitted. In the equivalent circuit shown in FIG. 4, what differs from FIG. 1 is that the drive transistors of NMOS transistors N1 and N2 are replaced by NMOS transistors N11 and N12 of which gate insulating film is formed of a material of a higher dielectric constant than that of the NMOS transistors N3 and N4. The other circuit composition is same as in FIG. 1, and the memory operation is same as in the prior art. The high permittivity material used in the gate insulating film of the NMOS transistors N11 and N12 is the same material as explained in the first embodiment.

In addition to the load transistors of PMOS transistors P11 and P12, the drive transistors of NMOS transistors N11 and N12 are formed by using a high permittivity material for the gate insulating film, same as in the first embodiment, while maintaining the high speed, the capacity of the memory nodes NA and NB is increased and resistance to soft errors is enhanced. In particular, as compared with the case of using the high permittivity material in the gate insulating film of the load transistors of PMOS transistors P11 and P12 only, by the portion of using the high permittivity material also in the gate insulating film of the NMOS transistors N11 and N12, the critical charge amount of the memory nodes can be increased, so that the resistance to soft errors is higher than in the first embodiment.

Figure 5:
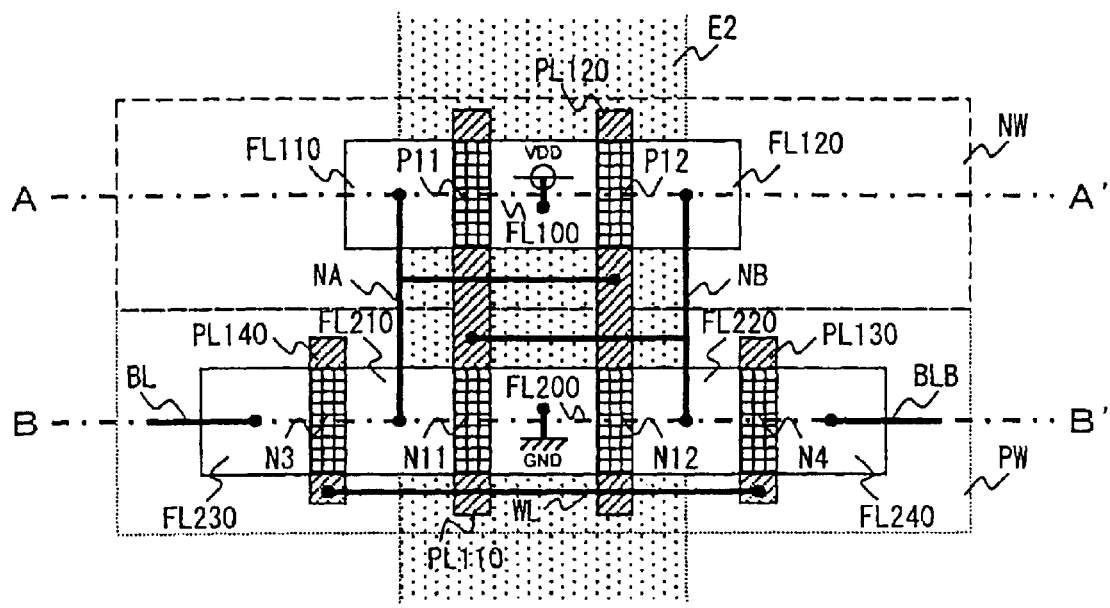
FIG. 5 is a layout diagram of SRAM memory cell corresponding to the semiconductor memory device in the second embodiment.

FIG. 5 is a layout diagram of SRAM memory cell corresponding to the equivalent circuit shown in FIG. 4. The layout diagram in FIG. 5 is similar to the layout diagram in FIG. 2 except that the gate insulating film of the NMOS transistors N11 and N12 is made of a high permittivity material. In particular, the high permittivity material is used in the lower layer area of the portion positioned within the N-well region NW and P-well region PW, of the composition of the polysilicon wiring layers PL110 and PL120 in FIG. 5.

To form the gate insulating film, first, an insulating film such as a conventional silicon oxide $SiO_2$ is formed in the entire surface of the P-well region PW and N-well region NW, and, masking a region E2 for forming PMOS transistors P11 and P12 and NMOS transistors N11 and N12, of the P-well region PW and N-well region NW, the insulating film formed on the region E2 is removed by etching. Then, the insulating film of high permittivity material is formed only in the region E2 again. The subsequent process is same as in the prior art. Moreover, the region for forming the insulating film of high permittivity material may be limited only in the region for forming the P+ diffusion regions FL100 and FL110 and N+ diffusion regions FL200, FL210 and FL220.

Figure 6:
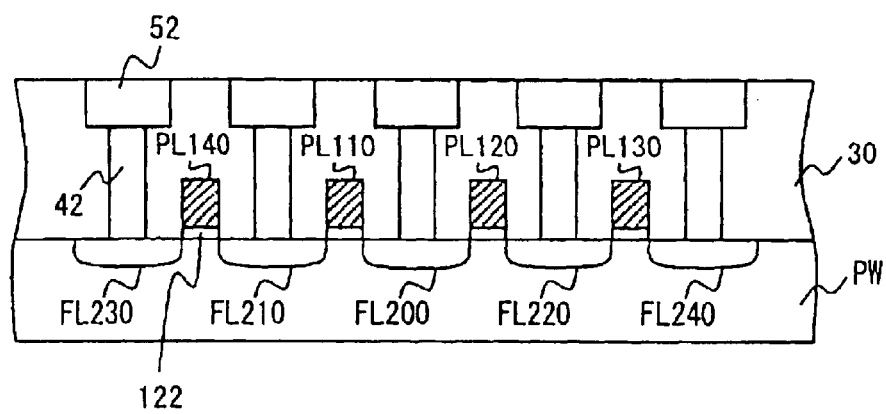
FIG. 6 is a sectional view along line B—B' of SRAM memory cell corresponding to the semiconductor memory device in the second embodiment.

FIG. 6 is a sectional view along line B—B' of SRAM memory cell shown in FIG. 5. In FIG. 6, the gate insulating film 122 of the NMOS transistors N11 and N12 formed on the P-well region PW is made of a high permittivity material. The sectional view along line A—A' of the P-well region PW forming the PMOS transistors P11 and P12 is same as shown in FIG. 3, and its explanation is omitted herein.

The gates of the NMOS transistors N3 and N4 functioning as access transistors are formed of insulating films by using a general dielectric material as explained in the first embodiment, and the capacity between the gate and substrate is suppressed low.

As explained herein, according to the semiconductor memory device of the second embodiment, a high permittivity material is used as the gate insulating film in both load transistors and drive transistors for forming the SRAM memory cell, without reducing the thickness of the gate insulating film, the capacity between the gate and substrate can be increased more than in the first embodiment. Accordingly, the critical charge amount necessary for inverting the held data in the memory nodes NA and NB is further increased, so that the resistance to soft errors can be much enhanced.

A semiconductor memory device of a third embodiment is explained. It is a feature of the semiconductor memory device of the third embodiment that a high permittivity material is used in the interlayer film in the region for forming load transistors.

Figure 7:
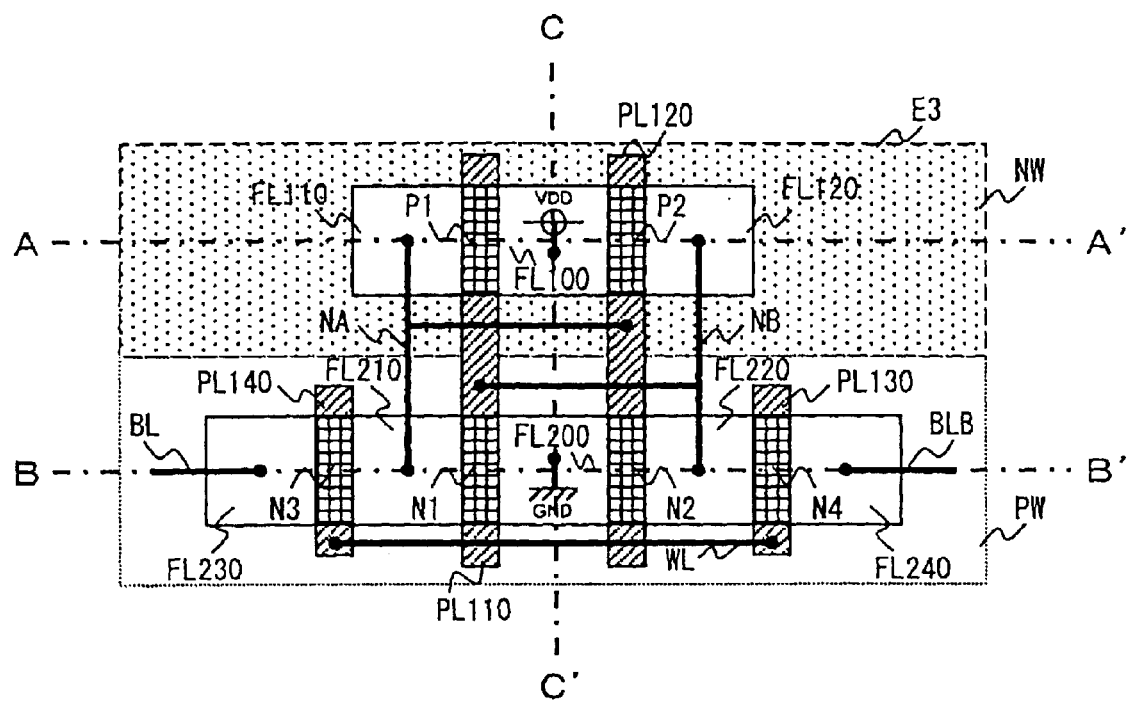
FIG. 7 is a layout diagram of SRAM memory cell corresponding to a semiconductor memory device in a third embodiment.

The equivalent circuit diagram of the semiconductor memory device of the third embodiment is same as in the prior art shown in FIG. 13, and its explanation is omitted. FIG. 7 is a layout diagram of SRAM memory cell corresponding to the semiconductor memory device in the third embodiment. The layout diagram shown in FIG. 7 is same as the layout diagram in FIG. 19, except that the interlayer film portion E3 in the region of forming the PMOS transistors P1 and P2 is made of a high permittivity material.

Specifically, in FIG. 7, as the insulating film between metal wirings on the region of forming the PMOS transistors P1 and P2, a material of a high dielectric constant is used in the interlayer film on the N-well region NW, and a material of a lower permittivity than that of the interlay film on the N-well region NW is used in the interlayer film on the P-well region PW. Moreover, the region for forming the interlayer film of high permittivity material may be limited to the region for forming the P+ diffusion region in the N-well region NW.

Figure 8:
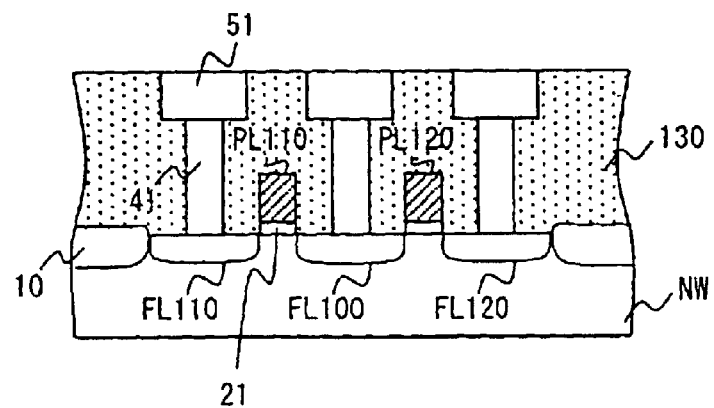
FIG. 8 is a sectional view along line A—A' of SRAM memory cell corresponding to the semiconductor memory device in the third embodiment.

FIG. 8 is a sectional view along line A—A' of SRAM memory cell layout shown in FIG. 7. As shown in FIG. 8, an interlayer film 130 is entirely covered with a material of high permittivity. As a result, it is effective to increase the coupling capacity due to the memory nodes NA and NB in the portion of forming the load transistors of PMOS transistors P1 and P2.

On the other hand, since the dielectric constant is low in the interlayer film of the contact hole forming area on the N+ diffusion regions FL230 and FL240, the coupling capacity due to bit lines BL and BLB is not increased. The sectional view along line B—B' of the P-well region PW forming the NMOS transistors N1 to N4 is same as shown in FIG. 21, and the P-well region PW is covered with a material of a relatively low dielectric constant.

Figure 9:
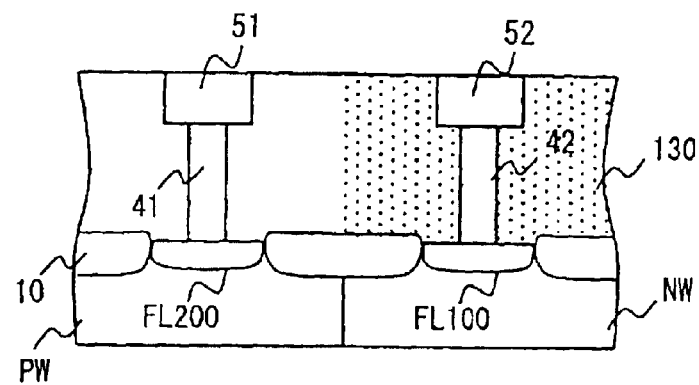
FIG. 9 is a sectional view along line C—C' of SRAM memory cell corresponding to the semiconductor memory device in the third embodiment.

FIG. 9 is a sectional view along line C—C' of SRAM memory cell layout shown in FIG. 7. As shown in FIG. 9, the boundary portion of the N-well region NW and P-well region PW is the boundary of the interlayer film of low permittivity and that of high permittivity.

As explained herein, according to the semiconductor memory device of the third embodiment, a high permittivity material is used only in the interlayer film in the region of forming the load transistors for composing the SRAM memory cell, a high access speed is maintained by using an interlayer film of low permittivity material in the region of forming the access transistors, and the coupling capacity due to memory nodes NA and NB can be increased, so that the resistance to soft errors can be enhanced.

The semiconductor memory device of a fourth embodiment will now be explained. It is a feature of the semiconductor memory device of the fourth embodiment that a high permittivity material is used in the interlayer film in the region for forming both load transistors and drive transistors for forming the SRAM memory cell.

Figure 10:
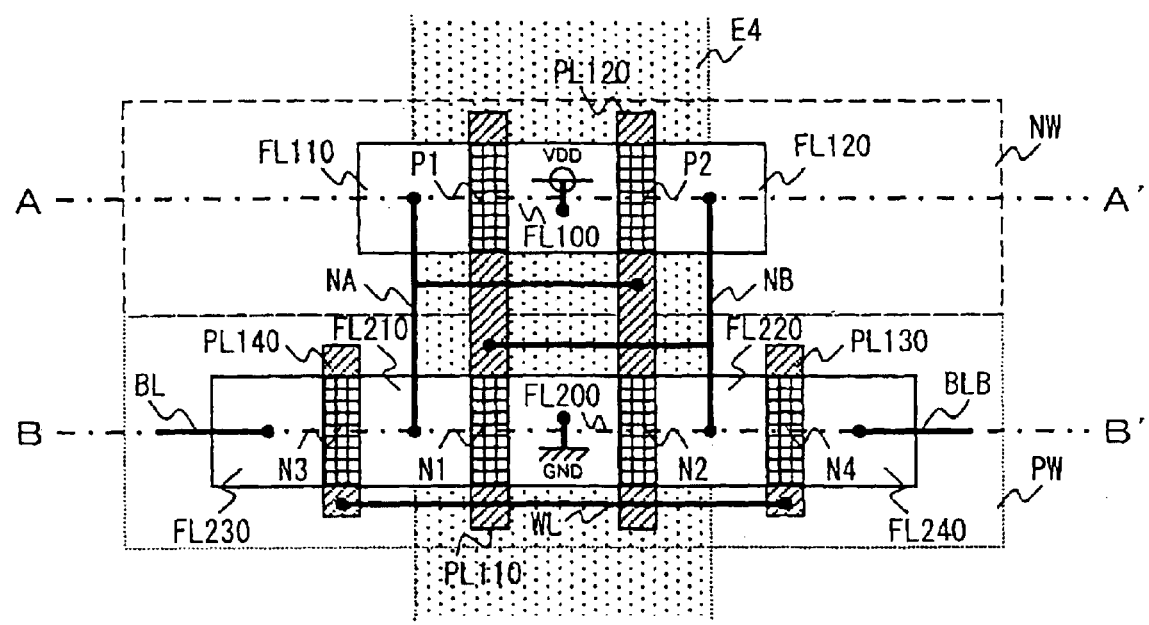
FIG. 10 is a layout diagram of SRAM memory cell corresponding to a semiconductor memory device in a fourth embodiment.

The equivalent circuit diagram of the semiconductor memory device of the fourth embodiment is same as in the prior art shown in FIG. 13, and its explanation is omitted. FIG. 10 is a layout diagram of SRAM memory cell corresponding to the semiconductor memory device in the fourth embodiment. The layout diagram shown in FIG. 10 is same as the layout diagram in FIG. 19, except that a high permittivity material is used in each interlayer film portion E4 of the region for forming the PMOS transistors P1 and P2 and the region for forming the NMOS transistors N1 and N2.

In addition to the region for forming the load transistors of PMOS transistors P1 and P2, the region for forming the drive transistors of NMOS transistors N1 and N2 is formed by using a high permittivity material for the interlayer film, same as in the third embodiment, while maintaining the high speed, the capacity of the memory nodes NA and NB is increased and resistance to soft errors is enhanced. In particular, as compared with the case of using the high permittivity material in the interlayer film of the load transistors of PMOS transistors P1 and P2 only, by the portion of using the high permittivity material also in the interlayer film of the NMOS transistors N1 and N2, the coupling capacity can be increased. As a result, the critical charge amount of the memory nodes can be increased, so that the resistance to soft errors is higher than in the third embodiment.

Figure 11:
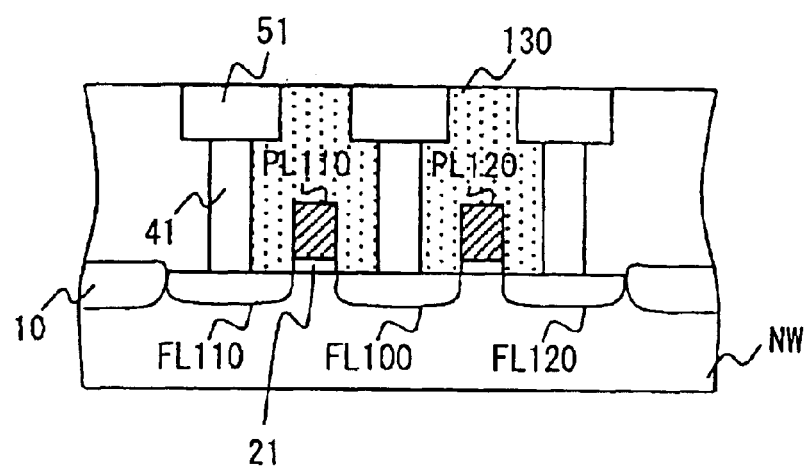
FIG. 11 is a sectional view along line A—A' of SRAM memory cell corresponding to the semiconductor memory device in the fourth embodiment.
Figure 12:
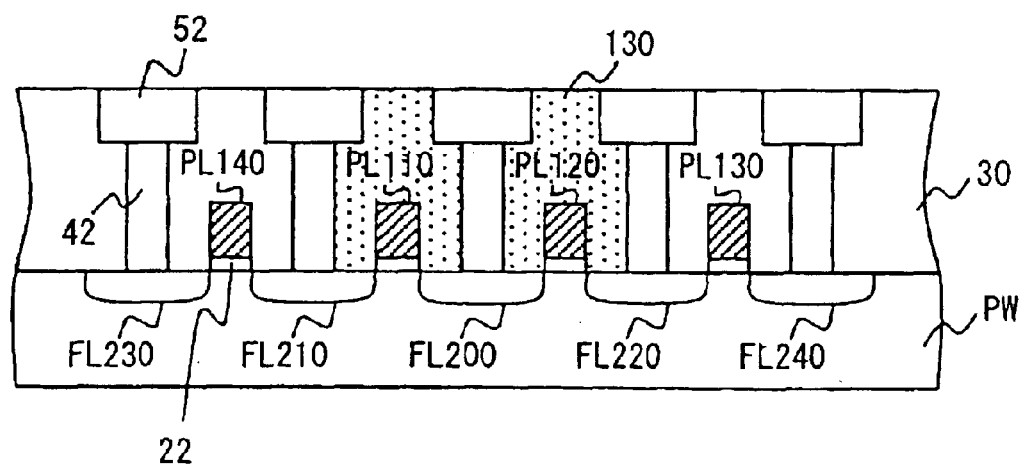
FIG. 12 is a sectional view along line B—B' of SRAM memory cell corresponding to the semiconductor memory device in the fourth embodiment.

FIG. 11 is a sectional view along line A—A' of SRAM memory cell layout shown in FIG. 10. FIG. 12 is a sectional view along line B—B' of SRAM memory cell layout shown in FIG. 10. As shown in FIG. 11 and FIG. 12, each interlayer film 130 of the region of the load transistors P1 and P2 and the region of the drive transistors N1 and N2 is covered with a material of high permittivity, while the interlayer film of the N+ diffusion regions FL230 and FL240 having the contact holes with the bit lines BL and BLB is covered with a material of a lower dielectric constant than that of the interlayer film 130. As a result, the coupling capacity due to the bit lines BL and BLB is not increased, and only the coupling capacity due to the memory nodes NA and NB is increased.

As explained herein, according to the semiconductor memory device of the fourth embodiment, a high permittivity material is used for forming only the interlayer films of both the region of load transistors and the region of drive transistors for forming the SRAM memory cell, a high access speed is maintained by using an interlayer film of low permittivity material in the region of forming the access transistors, and the coupling capacity due to memory nodes NA and NB can be increased more than in the third embodiment, so that the resistance to soft errors can be enhanced.

Figure 18:
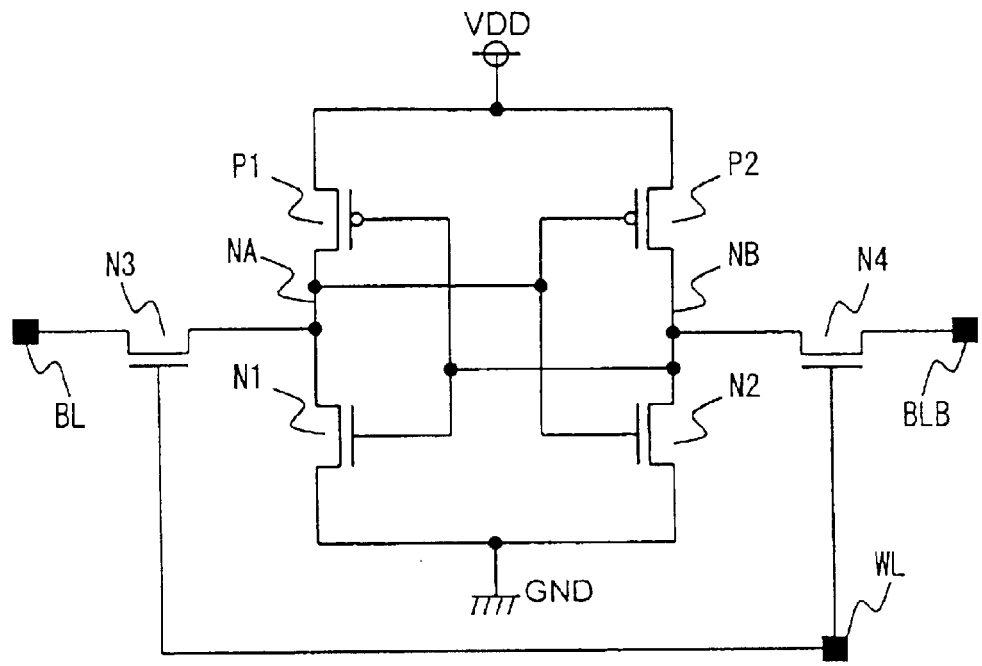
FIG. 18 is an equivalent circuit diagram of a conventional CMOS type SRAM memory.

The semiconductor memory device of a fifth embodiment will now be explained. The semiconductor memory device of the fifth embodiment is similar to the equivalent circuit shown in FIG. 1, FIG. 4, and FIG. 18, except that a dummy MOS transistor not contributing to memory operation of the memory cell is provided, in which the gate of the dummy MOS transistor is connected the memory nodes NA and NB to increase the capacity of the memory nodes, and the gate insulating material of the dummy MOS transistor is formed of a material of high permittivity.

A dummy MOS transistor is added to the configuration in FIG. 1 in which the gate insulating film of the PMOS transistors P11 and P12 contributing to memory operation of the memory cell is made of a material of high permittivity.

FIG. 13 is an equivalent circuit diagram of the semiconductor memory device in the fifth embodiment. In FIG. 13, parts common to FIG. 1 are identified with same reference numerals and their explanation is omitted. The equivalent circuit in FIG. 13 further comprises, in addition to the configuration in FIG. 1, a PMOS transistor PD1 of which gate is connected to the memory node NB and drain is connected to the memory node NA, and a PMOS transistor PD2 of which gate is connected to the memory node NA and drain is connected to the memory node NB.

These PMOS transistors PD1 and PD2 do not contribute to memory operation, but add a gate capacity and a drain capacity to the memory nodes NA and NB, thereby increasing the critical charge amount of the memory nodes NA and NB and enhancing the resistance to soft errors.

In particular, in the equivalent circuit diagram in FIG. 13, the gate insulating film of the dummy PMOS transistors PD1 and PD2 is made of a high permittivity material same as the gate insulating film of the PMOS transistors P11 and P12, and therefore the effects of the first embodiment are further enhanced.

Figure 14:
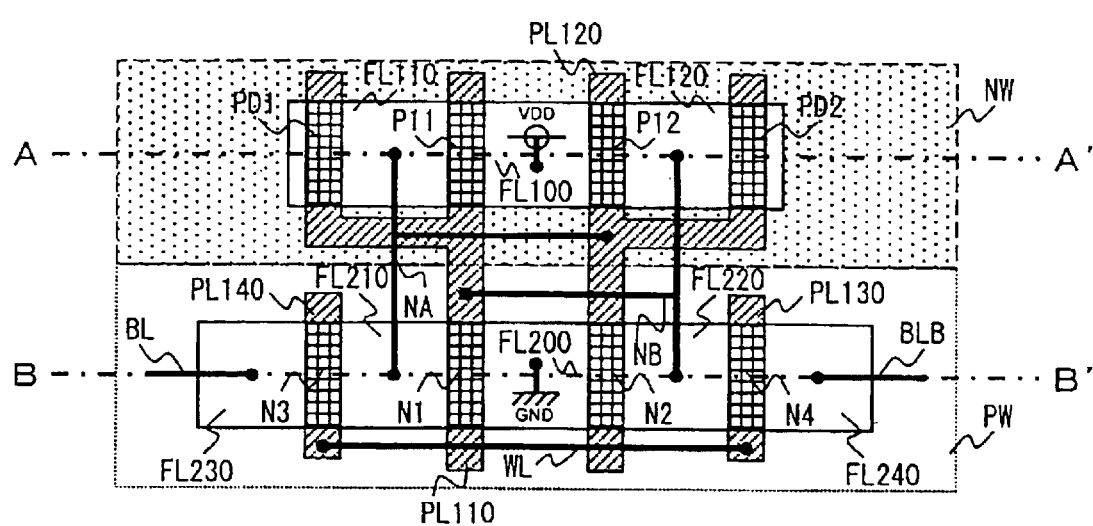
FIG. 14 is a layout diagram of SRAM memory cell corresponding to the semiconductor memory device in the fifth embodiment.

FIG. 14 is a layout diagram of SRAM memory cell corresponding to the equivalent circuit shown in FIG. 13. The layout diagram shown in FIG. 14 is same as the layout diagram shown in FIG. 2, except for the following points. That is, the PMOS transistor PD1 shares the P+ diffusion region FL110 with the PMOS transistor P11 as the drain region, the PMOS transistor PD2 shares the P+ diffusion region FL120 with the PMOS transistor P12 as the drain region, the gate region of the PMOS transistor PD1 is formed of the common polysilicon wiring layer PL110 for forming the gate regions of the PMOS transistor P11 and NMOS transistor N1, and the gate region of the PMOS transistor PD2 is formed of the common polysilicon wiring layer PL120 for forming the gate regions of the PMOS transistor P12 and NMOS transistor N2.

High permittivity material is used in the lower layer portion of the area positioned within the N-well region NW, of the composition of the polysilicon wiring layers PL110 and PL120. The forming method of the gate insulating film of the PMOS transistors PD1 and PD2 is same as the forming method of the gate insulating film of the PMOS transistors P11 and P12 explained in the first embodiment, and its explanation is omitted herein.

Figure 15:
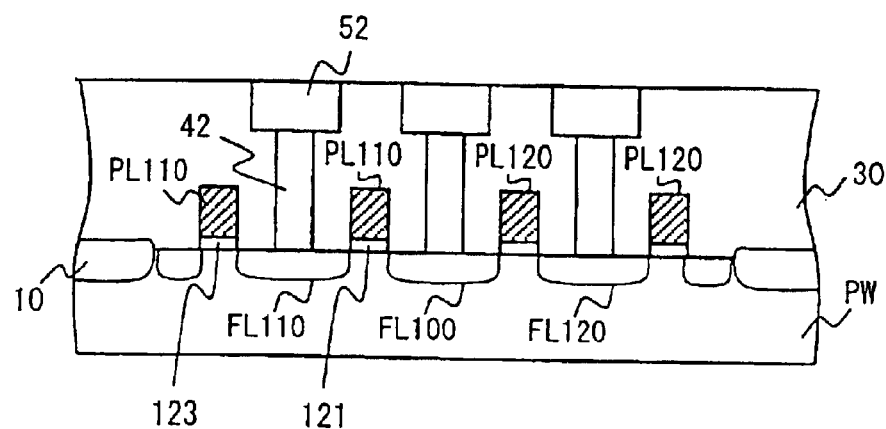
FIG. 15 is a sectional view along line A—A' of SRAM memory cell corresponding to the semiconductor memory device in the fifth embodiment.

FIG. 15 is a sectional view along line A—A' of SRAM memory cell layout shown in FIG. 14. In FIG. 15, the gate insulating film 123 of the dummy PMOS transistors PD1 and PD2 formed on the N-well region NW is formed of the same high permittivity material as the gate insulating film 121 of the PMOS transistors P11 and P12. The sectional view along line B—B' of the P-well region PW forming the NMOS transistors N1 to N4 is same as shown in FIG. 21, and its explanation is omitted herein.

As explained herein, according to the semiconductor memory device of the fifth embodiment, a high permittivity material is used for forming the gate insulating films not only in the load transistors for composing the SRAM memory cell, but also in the dummy PMOS transistors PD1 and PD2 of which gate is connected to the memory nodes NA and NB for increasing the capacity of the memory nodes NA and NB, and therefore the capacity between the gate and substrate can be further increased. Therefore, the critical charge amount for inverting the held data in the memory nodes NA and NB is further increased, so that the resistance to soft errors can be enhanced.

In this example, the dummy MOS transistors connected to the memory nodes NA and NB are PMOS transistors PD1 and PD2, but one of them may be used, or NMOS transistors may be used instead of PMOS transistors.

The semiconductor memory device of a sixth embodiment will now be explained. In the semiconductor memory device of the sixth embodiment, a high permittivity material is used as the gate insulating film in all of load transistors and drive transistors for composing 2-port SRAM memory cell.

Figure 16:
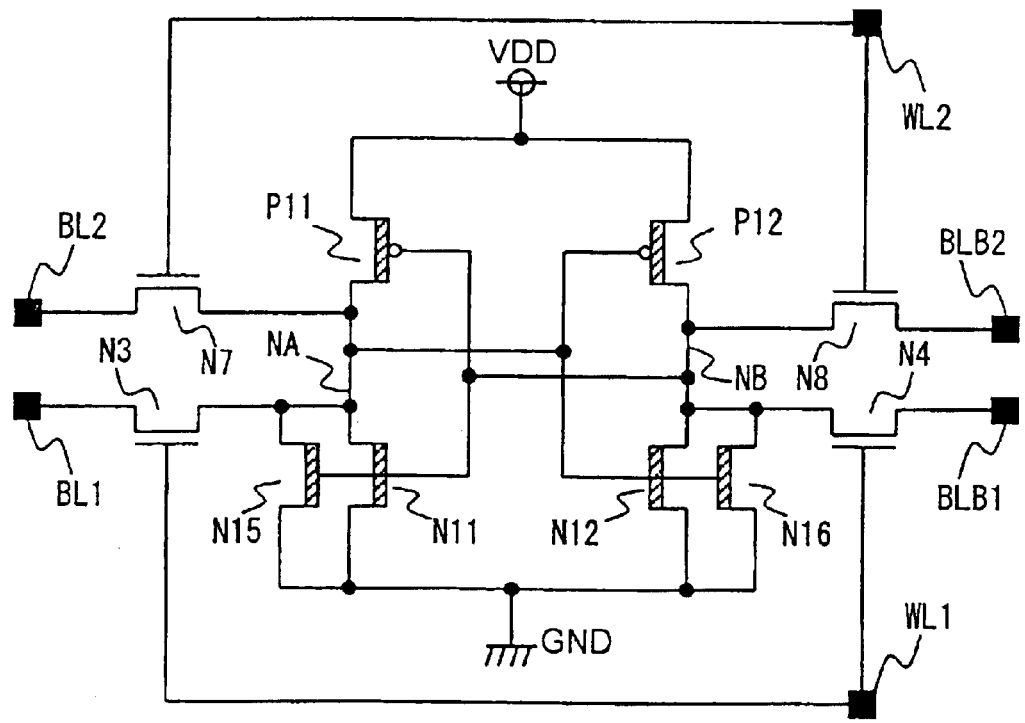
FIG. 16 is an equivalent circuit diagram of a semiconductor memory device in a sixth embodiment.

FIG. 16 is an equivalent circuit diagram of the semiconductor memory device in the sixth embodiment, showing an equivalent circuit of 2-port SRAM memory cell. In FIG. 16, PMOS transistor P11 and NMOS transistor N11 (or N15) compose a first CMOS inverter, and PMOS transistor P12 and NMOS transistor N12 (or N16) compose a second CMOS transistor, and input and output terminals are complementarily connected between these CMOS inverters.

That is, by these MOS transistors P11, P12, N11, N12, N15, and N16, a flip-flop circuit is composed, and data can be written and read, in FIG. 16, at the memory node NA which is the output point of the first CMOS inverter and input point of the second CMOS inverter, and the memory node NB which is the output point of the second CMOS inverter and input point of the first CMOS inverter.

The NMOS transistors N3, N4, N7 and N8 function as access gates, and the NMOS transistor N3 has its gate connected to the first word line WL1, its source connected to the memory node NA, and its drain connected to the first positive phase bit line BL1. The NMOS transistor N7 has its gate connected to the second word line WL2, its source connected to the memory node NA, and its drain connected to the second positive phase bit line BL2.

The NMOS transistor N4 has its gate connected to the first word line WL1, its source connected to the memory node NB, and its drain connected to the first negative phase bit line BLB1. The NMOS transistor N8 has its gate connected to the second word line WL2, its source connected to the memory node NB, and its drain connected to the second negative phase bit line BLB2.

That is, by selecting the first word line WL1, first positive phase bit line BL1 and first negative phase bit line BLB1, the held data can be read out by the first port, and by selecting the second word line WL2, second positive phase bit line BL2 and second negative phase bit line BLB2, the held data can be read out by the second port.

The equivalent circuit shown in FIG. 16 itself is not different at all from the conventional 2-port SRAM memory cell, but the semiconductor memory device of the sixth embodiment differs only in that each gate insulating film of the PMOS transistors P11 and P12, and NMOS transistors N11, N12, N15 and N16 for composing one 2-port SRAM memory cell is made of the high permittivity material as explained in the first embodiment.

Figure 17:
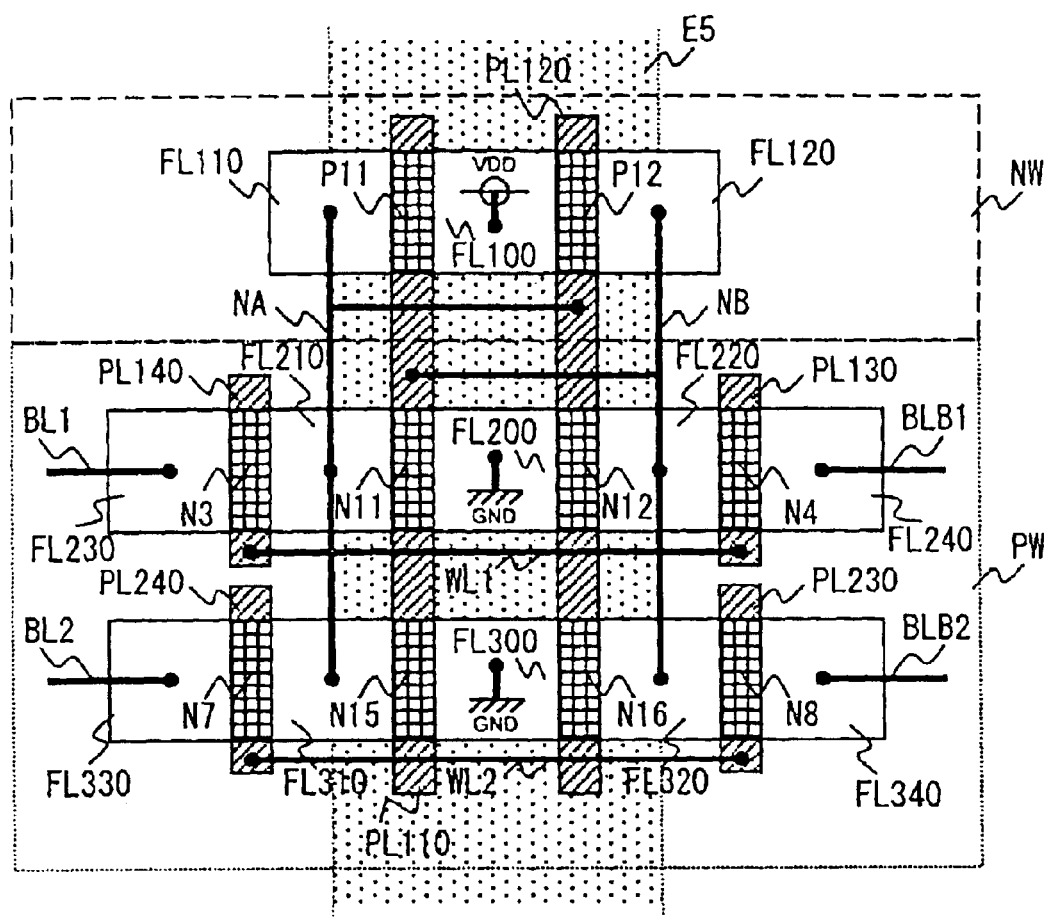
FIG. 17 is a layout diagram of 2-port SRAM memory cell for composing the semiconductor memory device in the sixth embodiment.

FIG. 17 is a layout diagram of 2-port SRAM memory cell for composing the semiconductor memory device in the sixth embodiment. As shown in FIG. 17, one 2-port SRAM memory cell is formed on the N-type well region NW and P-type well region PW formed on a semiconductor substrate. The PMOS transistors P11 and P12 shown in the equivalent circuit in FIG. 16 are formed in the same N-well region NW, and the NMOS transistors N3, N4, N7, N8, N11, N12, N15 and N16 are formed in the same P-well region PW.

In the layout diagram in FIG. 17, in the P-well region PW shown in FIG. 5, N+ diffusion regions FL300, FL310, FL320, FL330 and FL340 are further formed, and using these N+ diffusion regions as source region or drain region, the NMOS transistors N7, N8, N15 and N16 are formed, but this is same as an example of layout of the conventional 2-port SRAM memory cell, and the explanation of the detail is omitted.

Hence, in FIG. 17, too, the high permittivity material is used only in the lower layer portion in the area positioned within the N-well region NW and P-well region PW, of the composition of the polysilicon wiring layers PL110 and PL120. The forming method of the gate insulating film is same as explained in the second embodiment, and its explanation is omitted herein. In FIG. 17, the insulating film of high permittivity material is formed in the portion of region E5.

As explained herein, according to the semiconductor memory device of the sixth embodiment, also in the 2-port SRAM memory cell composed by using load transistors having the gate connected to the memory nodes NA and NB of the SRAM memory cell, in all of the load transistors and drive transistors, by using the high permittivity material as the gate insulating film, the same effects as in the second embodiment are obtained.

According to the invention, as explained above, by using a material of a high dielectric constant in the gate insulating film of load transistors contributing to capacity of memory nodes, the capacity of the memory nodes can be increased and the critical charge amount is increased, so that the resistance to soft errors can be enhanced.

Furthermore, by using a material of a high dielectric constant in the gate insulating film of drive transistors contributing to capacity of memory nodes, in addition to the gate insulating film of load transistors contributing to capacity of memory nodes, the capacity of the memory nodes can be increased and the critical charge amount is further increased, so that the resistance to soft errors can be enhanced.

Moreover, in the layout of electrically connecting the gates of the load transistors and the gates of the drive transistors through a common electrode wiring layer, the same effects as above can be obtained.

Furthermore, in the memory cell configuration by connecting the gates of dummy MOS transistors to the memory nodes, the same effects as above can be obtained.

Moreover, in the memory cell configuration by connecting the gates of dummy MOS transistors to the memory nodes, in the layout of electrically connecting the gates of the dummy MOS transistors through a common electrode wiring layer common to the gates of the load transistors and the gates of the drive transistors, the same effects as above can be obtained.

Furthermore, by setting the dielectric constant of the interlayer film in the region forming the memory nodes different from the dielectric constant of the interlayer film of other regions, the coupling capacity between the memory nodes is changed, and the resistance to soft errors can be controlled.

Moreover, by setting the dielectric constant of the interlayer film in the region forming the memory nodes larger than the dielectric constant of the interlayer film of other regions, the coupling capacity between the memory nodes is increased, and the resistance to soft errors can be enhanced.

Furthermore, since a material of a high dielectric constant is used only in the interlayer film on the N-well region for forming the transistor elements out of the region for forming the memory nodes, the use of the relatively expensive high permittivity material is limited to a minimum area.

Moreover, since a material of a high dielectric constant is used only in the interlayer film on the P-well region for forming the transistor elements out of the region for forming the memory nodes, the use of the relatively expensive high permittivity material is limited to a minimum area.

In addition, since a material of a high dielectric constant is used only in the interlayer film disposed in the section from the top of the region for forming the transistor elements to the metal wiring layer out of the region for forming the memory nodes, the use of the relatively expensive high permittivity material is limited to a minimum area.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor memory device comprising plural transistor element regions formed in a semiconductor layer within a same chip, and a wiring region formed by laminating plural metal wiring layers and interlayer films on the top of the transistor element regions, wherein a dielectric constant of a specified portion of the interlayer film laminated on the transistor element regions is different from a dielectric constant of the interlayer film in areas other than the specified portion.

2. The semiconductor memory device according to claim 1, wherein the specified portion is a region on the transistor element region for composing a memory cell out of the plural transistor element regions.

3. The semiconductor memory device according to claim 2, wherein the specified portion is positioned on an N-well region for forming the transistor element.

4. The semiconductor memory device according to claim 2, wherein the specified portion is positioned on a P-well region for forming the transistor element.

5. The semiconductor memory device according to claim 2, wherein the specified portion is positioned in a layer between the highest layer for composing the transistor element and the metal wiring layer for electrically connecting with the transistor element.

* * * * *